United States Patent
Mitchell

(10) Patent No.: US 11,174,355 B2
(45) Date of Patent: Nov. 16, 2021

(54) ISOLATION METHOD FOR WATER INSOLUBLE COMPONENTS OF A BIOMASS

(71) Applicant: Green Extraction Technologies, Greer, SC (US)

(72) Inventor: Melvin Mitchell, Penrose, NC (US)

(73) Assignee: Green Extraction Technologies, Brevard, NC (US)

( * ) Notice: Subject to any disclaimer, the term of this patent is extended or adjusted under 35 U.S.C. 154(b) by 0 days.

(21) Appl. No.: 16/863,135

(22) Filed: Apr. 30, 2020

(65) Prior Publication Data

US 2020/0381879 A1     Dec. 3, 2020

Related U.S. Application Data

(63) Continuation of application No. 15/416,570, filed on Jan. 26, 2017, now abandoned, which is a
(Continued)

(51) Int. Cl.
*C08H 7/00*     (2011.01)
*C08B 15/08*    (2006.01)
(Continued)

(52) U.S. Cl.
CPC .............. *C08H 6/00* (2013.01); *C08B 15/08* (2013.01); *C08B 37/0057* (2013.01);
(Continued)

(58) Field of Classification Search
CPC .................................. D21C 3/02; D21C 3/224
See application file for complete search history.

(56) References Cited

U.S. PATENT DOCUMENTS

| 1,951,519 A | 3/1934 | Milne |
| 2,226,429 A | 12/1940 | Hall |

(Continued)

FOREIGN PATENT DOCUMENTS

| WO | 9218691 A1 | 10/1992 |
| WO | 2006111604 | 10/2006 |

(Continued)

OTHER PUBLICATIONS

International Preliminary Report on Patentablity of the International Searching Authority corresponding to International Application No. PCT/US2014/050542 dated Feb. 16, 2016, USPTO.

(Continued)

*Primary Examiner* — Liam J Heincer
(74) *Attorney, Agent, or Firm* — F. Michael Sajovec; Williams Mullen

(57) ABSTRACT

The process includes pretreating the biomass with a first basic solution such as sodium hydroxide and mechanically altering the fibers to provide a fluidized biomass. The fluidized biomass is then subjected to high frequency pulses and shear forces without denaturing the individual components of the biomass. The biomass is then subjected to compressive force to separate a first liquid fraction from a first fractionated biomass. The first fractionated biomass may again then be subjected to the same high frequency pulses and shear forces as previously, particularly if there are hemicellulose and/or sugars still present in the first fractionated biomass. Compressive forces are used to separate a second liquid fraction from a second fractionated biomass. The second fractionated biomass is subjected to oxidation such as with hydrogen peroxide at a pH of 8 to 12. The second fractioned biomass is then subjected to compressive forces to separate one or more water insoluble components of the biomass in water soluble form.

10 Claims, 1 Drawing Sheet

Related U.S. Application Data continuation of application No. 14/454,972, filed on Aug. 8, 2014, now abandoned.

(60) Provisional application No. 61/864,853, filed on Aug. 12, 2013, provisional application No. 61/909,418, filed on Nov. 27, 2013, provisional application No. 61/919,194, filed on Dec. 20, 2013.

(51) Int. Cl.

| | | |
|---|---|---|
| C08B 37/00 | (2006.01) | |
| C08H 8/00 | (2010.01) | |
| D21C 3/02 | (2006.01) | |
| D21C 3/22 | (2006.01) | |
| H01R 13/627 | (2006.01) | |
| H01R 13/6594 | (2011.01) | |
| H01R 24/60 | (2011.01) | |
| H05K 5/00 | (2006.01) | |
| D21C 1/02 | (2006.01) | |
| D21H 11/00 | (2006.01) | |
| C08G 63/06 | (2006.01) | |
| C08G 63/91 | (2006.01) | |

(52) U.S. Cl.
CPC .......... *C08G 63/06* (2013.01); *C08G 63/912* (2013.01); *C08H 8/00* (2013.01); *D21C 1/02* (2013.01); *D21C 3/02* (2013.01); *D21C 3/224* (2013.01); *D21H 11/00* (2013.01); *H01R 13/6272* (2013.01); *H01R 13/6273* (2013.01); *H01R 13/6594* (2013.01); *H01R 24/60* (2013.01); *H05K 5/0069* (2013.01)

(56) References Cited

U.S. PATENT DOCUMENTS

| | | | |
|---|---|---|---|
| 2,697,701 | A | 12/1954 | Heritage et al. |
| 3,338,416 | A | 8/1967 | Barry |
| 4,269,362 | A | 5/1981 | Berggren |
| 4,806,475 | A | 2/1989 | Gould |
| 4,991,720 | A | 2/1991 | Höglund et al. |
| 5,306,392 | A | 4/1994 | Mita |
| 5,458,897 | A | 10/1995 | Paré |
| 5,498,766 | A | 3/1996 | Stuart et al. |
| 5,704,559 | A | 1/1998 | Fröberg et al. |
| 5,730,837 | A | 3/1998 | Black |
| 5,813,618 | A | 9/1998 | Prew |
| 5,859,236 | A | 1/1999 | Burkart |
| 6,302,997 | B1 | 10/2001 | Hurter et al. |
| 6,447,815 | B1 | 9/2002 | Menon et al. |
| 6,770,168 | B1 | 8/2004 | Stigsson |
| 7,396,434 | B2 | 7/2008 | Rodriguez Rivera et al. |
| 7,478,773 | B2 | 1/2009 | Gingras et al. |
| 7,504,245 | B2 | 3/2009 | Kinley et al. |
| 7,658,955 | B2 | 2/2010 | D'Amelio, Sr. et al. |
| 7,678,358 | B2 | 3/2010 | Eckert et al. |
| 7,842,161 | B2 | 11/2010 | van Heiningen et al. |
| 7,892,397 | B2 | 2/2011 | Luo et al. |
| 8,013,195 | B2 | 9/2011 | McCall et al. |
| 8,038,840 | B2 | 10/2011 | Li |
| 8,268,125 | B2 | 9/2012 | Retsina et al. |
| 8,404,884 | B2 | 3/2013 | Reaney et al. |
| 8,465,559 | B2 | 6/2013 | Guay et al. |
| 8,475,627 | B2 | 7/2013 | van Heiningen et al. |
| 8,497,091 | B2 | 7/2013 | Hanakawa et al. |
| 8,511,595 | B2 | 8/2013 | Lindroos et al. |
| 8,585,863 | B2 | 11/2013 | Retsina et al. |
| 8,609,379 | B2 | 12/2013 | Chheda et al. |
| 8,741,632 | B2 | 6/2014 | Lee et al. |
| 8,765,846 | B2 | 7/2014 | Balakshin et al. |
| 2002/0132121 | A1 | 9/2002 | Palacio et al. |
| 2002/0148575 | A1 | 10/2002 | Wingerson |
| 2004/0138445 | A1 | 7/2004 | Thorre |
| 2006/0147556 | A1 | 7/2006 | Brewer |
| 2007/0128236 | A1 | 6/2007 | Erskine |
| 2008/0029233 | A1 | 2/2008 | Wingerson et al. |
| 2008/0032344 | A1 | 2/2008 | Fallavollita |
| 2008/0295980 | A1 | 12/2008 | Hallberg et al. |
| 2008/0317661 | A1 | 12/2008 | Eckert et al. |
| 2010/0059609 | A1 | 3/2010 | Teeter, Jr. et al. |
| 2010/0119469 | A1 | 5/2010 | Wu et al. |
| 2010/0167339 | A1 | 7/2010 | Clayton |
| 2010/0325947 | A1 | 12/2010 | Ohman et al. |
| 2011/0003370 | A1 | 1/2011 | Gordon et al. |
| 2011/0100359 | A1 | 5/2011 | North |
| 2011/0245444 | A1 | 10/2011 | Miller et al. |
| 2011/0313141 | A1 | 12/2011 | Brooks |
| 2012/0000621 | A1* | 1/2012 | Stigsson ............ C08B 16/00 162/158 |
| 2012/0108798 | A1 | 5/2012 | Wenger et al. |
| 2012/0197052 | A1 | 8/2012 | Matthews |
| 2012/0282383 | A1 | 11/2012 | Hassan et al. |
| 2013/0005952 | A1 | 1/2013 | Belanger et al. |
| 2013/0202905 | A1 | 8/2013 | Blount |
| 2013/0213245 | A1 | 8/2013 | Henderson et al. |
| 2013/0216520 | A9 | 8/2013 | Medoff |
| 2013/0224816 | A1 | 8/2013 | Elliott et al. |
| 2013/0225855 | A1 | 8/2013 | Ryba et al. |
| 2013/0225856 | A1 | 8/2013 | Ryba et al. |
| 2013/0288307 | A1 | 10/2013 | Medoff |
| 2014/0024093 | A1 | 1/2014 | Blackbourn et al. |
| 2014/0045226 | A1 | 2/2014 | Wicking et al. |
| 2014/0096830 | A1 | 4/2014 | Gastaldo et al. |
| 2014/0107353 | A1 | 4/2014 | Qiao et al. |
| 2014/0121359 | A1 | 5/2014 | Thies et al. |
| 2014/0135470 | A1 | 5/2014 | Murray et al. |
| 2014/0174680 | A1 | 6/2014 | Hawkins et al. |
| 2014/0182801 | A1 | 7/2014 | Hawkins et al. |
| 2014/0190471 | A1 | 7/2014 | Zhang |
| 2014/0196715 | A1 | 7/2014 | Torres et al. |
| 2014/0227742 | A1 | 8/2014 | Bao et al. |

FOREIGN PATENT DOCUMENTS

| | | | |
|---|---|---|---|
| WO | 2010058185 | A1 | 5/2010 |
| WO | 2010075594 | A2 | 7/2010 |
| WO | 2013144453 | | 10/2013 |
| WO | 2013185344 | A1 | 12/2013 |
| WO | 2014046543 | A1 | 3/2014 |

OTHER PUBLICATIONS

International Preliminary Report on Patentablity of the International Searching Authority corresponding to International Application No. PCT/US2014/050536 dated Feb. 16, 2016, USPTO.

International Preliminary Report on Patentablity of the International Searching Authority corresponding to International Application No. PCT/US2014/050529 dated Feb. 16, 2016, USPTO.

International Preliminary Report on Patentablity of the International Searching Authority corresponding to International Application No. PCT/US2014/050531 dated Feb. 16, 2016, USPTO.

Scott-Thomas "Technology disrupts cell structure for better bioavailability", http://www.nutraingredients-usa.com/Article/2010/02/22/Technology-disrupts-cell-structure-for-better-bioavailability . . . 4 pages (2015).

Bozell, J. et al., Clean Fractionation of Biomass, U.S. Department of Energy by the National Renewable Energy Laboratory.

Du, X et al., Universal Fractionation of Lignin-Carbohydrate Complexes (LCCS) From Lignocellulosic Biomass: An Example Using Spruce Wood. Plant J. Apr. 2013, vol. 74, No. 2; pp. 328-338.

Kumar, P. et al., Methods for Pretreatment of Lignocellulosic Biomass for Efficient Hydrolysis and Biofuel Production, Industrial & Engineering Chemistry Research, Mar. 20, 2009, 18 pages.

Li, J. et al., Fractionation and Characterization of Lignon-Carbohydrate Complexes (LCCS) From Eucalyptus Fibers. Holzforschung. Nov. 2010, vol. 65; pp. 43-50.

Notification of Transmittal of the International Search Report and the Written Opinion of the International Searching Authority, or the

(56) References Cited

OTHER PUBLICATIONS

Declaration corresponding to International Application No. PCT/US2015/15378 dated May 14, 2015.
Notification of Transmittal of the International Search Report and the Written Opinion of the International Searching Authority, or the Declaration corresponding to International Application No. PCT/US2015/15368 dated May 18, 2015.
Notification of Transmittal of the International Search Report and the Written Opinion of the International Searching Authority, or the Declaration corresponding to International Application No. PCT/US2014/050542 dated Nov. 14, 2014.
Notification of Transmittal of the International Search Report and the Written Opinion of the International Searching Authority, or the Declaration corresponding to International Application No. PCT/US2014/050536 dated Nov. 14, 2014.
Notification of Transmittal of the International Search Report and the Written Opinion of the International Searching Authority, or the Declaration corresponding to International Application No. PCT/US2014/050529 dated Nov. 13, 2014.
Notification of Transmittal of the International Search Report and the Written Opinion of the International Searching Authority, or the Declaration corresponding to International Application No. PCT/US2014/050531 dated Nov. 13, 2014.
Banerjee et al. "Alkaline peroxide pretreatment of corn stover: effects of biomass, peroxide, and enzyme loading and composition on yields of glucose and xylose", Biotechnology for Biofuels 4(16): 1-15 (2011).
Banerjee et al. "Scale-Up and Integration of Alkaline Hydrogen Peroxide Pretreatment, Enzymatic Hydrolysis, and Ethanolic Fermentation", *Biotechnology and Bioengineering* 109(4):922-931 (2012).
Kim et al, "Front-end recovery of protein from lignocellulosic biomass and its effects on chemical pretreatment and enzymatic saccharification", *Bioprocess Biosyst Eng.* 36:687-694 (2013).
Sun et al. "Production and extraction of sugars from switchgrass hydrolyzed in ionic liquids", *Biotechnology for Biofuels* 6(39): 1-14 (2013).
Xu et al. "Delignification of Switcharass Cultivars for Bioethanol Production" *BioResources* 6(1):707-720 (2011).
Iskalieva, A. et al., Cavitation assisted delignification of wheat straw: A review, Article in Ultrasonic Sonochemistry, 19 (2012) pp. 984-993.
Dominguez de Maria P. et al., Current Trends in Pretreatment and Fractionation of Lignocellulose as Reflected in Industrial Patent Activities, Chem. Ing. Tech. 2015, 87, No. 12, pp. 1686-1695.
Explore reference by research topic: Extraction of Lignin from biomass retrieved from http://scifinder.cas.org on Apr. 21, 2016.
Bussemaker et al., Effect of Ultrasound on Lignocellulosic Biomass as a Pretreatment for Biorefinery and Biofuel Applications, Industrial & Engineering Chemistry Research (IECR), 2013, 52, pp. 3563-3580.

\* cited by examiner

ISOLATION METHOD FOR WATER INSOLUBLE COMPONENTS OF A BIOMASS

CROSS-REFERENCE TO RELATED APPLICATIONS

This application is a continuation application of U.S. application Ser. No. 15/416,750, filed Jan. 26, 2017, which is a continuation application of U.S. application Ser. No. 14/454,972, filed Aug. 8, 2014, which claims priority to U.S. Provisional Patent Application Ser. No. 61/864,853, filed Aug. 12, 2013; U.S. Provisional Patent Application Ser. No. 61/909,418, filed Nov. 27, 2013; and U.S. Provisional Patent Application Ser. No. 61/919,194, filed Dec. 20, 2013, the disclosures of which are incorporated herein by reference in their entireties.

FIELD OF THE INVENTION

The present invention relates to a process for isolating components of a biomass. Examples of fractions and extractives provided in the process include the extraction, isolation, and purification of lignin, cellulose, sugars, hemicellulose, fibers and/or extractives.

BACKGROUND OF THE INVENTION

Natural cellulosic feedstocks are typically referred to as "biomass." Many types of biomass, including wood, paper, agricultural residues, herbaceous crops, and lignocellulosic municipal and industrial solid wastes have been considered as feedstocks for the production and preparation of a wide range of goods. Plant biomass materials are comprised primarily of cellulose, hemicellulose and lignin, bound together in a complex and entangled gel-like structure along with amounts of extractables, pectins, proteins and/or ash. Thus, successful commercial use of biomass as a chemical feedstock depends on the efficient and/or economical separation and isolation of these various constituents.

Many steps are often required in production, harvesting, storage, transporting, and processing of biomass to yield useful products. One step in the processing is the separation, or fractionation, of the biomass into its major components: extractives, hemicellulose, lignin, and cellulose. Many approaches have been investigated for disentangling the complex structure of the biomass. Once this separation has been achieved, a variety of paths are opened for further processing of each component into marketable products. For example, the possibility of producing products such as biofuels, polymers and latex replacements from biomass has recently received much attention. This attention is due to the availability of large amounts of cellulosic feedstock, the need to minimize burning or landfilling of waste cellulosic materials, and the usefulness of sugar and cellulose as raw materials substituting for oil-based products.

One component of the biomass that the isolation of which has been of interest is lignin. Lignin is a cross-linked racemic macromolecule with molecular masses in excess of 10,000 Da. It is relatively hydrophobic and aromatic in nature. The degree of polymerization in nature is difficult to measure, since it is often fragmented during typical extraction and the molecule consists of various types of substructures that appear to repeat in a haphazard manner. Different types of lignin have been described depending on the means of isolation.

There are three monolignol monomers, methoxylated to various degrees: p-coumaryl alcohol, coniferyl alcohol, and sinapyl alcohol. These lignols are incorporated into lignin in the form of the phenylpropanoids p-hydroxyphenyl (H), guaiacyl (G), and syringyl (S), respectively. Gymnosperms have a lignin that consists almost entirely of G with small quantities of H. That of dicotyledonous angiosperms is more often than not a mixture of G and S (with very little H), and monocotyledonous lignin is a mixture of all three. Many grasses have mostly G, while some palms have mainly S. All lignins contain small amounts of incomplete or modified monolignols, and other monomers are prominent in non-woody plants.

Likewise, cellulose, another component of the biomass has also been of particular interest, particularly with respect to the paper industry and in the production of biofuels. Cellulose is an organic compound with the formula $(C_6H_{10}O_5)_n$, a polysaccharide consisting of a linear chain of several hundred to over ten thousand $\beta(1\rightarrow 4)$ linked D-glucose units. Cellulose is an important structural component of the primary cell wall of green plants, many forms of algae and the oomycetes. Cellulose is an extremely abundant organic polymer on Earth. The cellulose content of cotton fiber is 90%, that of wood is 40-50% and that of dried hemp is approximately 45%. Cellulose is mainly used to produce paperboard and paper. Smaller quantities are converted into a wide variety of derivative products such as cellophane and rayon.

Thus, there continues to be a need for improved systems and methods for separating solid biomass into its individual constituent components, particularly lignin, hemicelluloses, and cellulose that take into consideration factors such as environmental and energy concerns, efficiency and cost-effectiveness.

SUMMARY OF THE INVENTION

It should be appreciated that this Summary is provided to introduce a selection of concepts in a simplified form, the concepts being further described below in the Detailed Description. This Summary is not intended to identify key features or essential features of this disclosure, nor is it intended to limit the scope of the invention.

The present invention provides a process for isolating various components of biomass that may be adapted to large-scale production, uses environmentally friendly solvents and/or is energy efficient. Moreover, the present invention provides a process for isolating various water insoluble components of the biomass in water soluble form while providing a biomass substantially devoid of hemicellulose, other sugars, and the water insoluble components.

The process includes pretreating the biomass with a first basic solution such as sodium hydroxide. Pretreatment may include mechanically altering the fibers to, for example, open up the fibers and to form a fluidized biomass. The biomass with opened up fibers is then subjected to high frequency pulses and shear forces without denaturing the individual components of the biomass. The biomass is then subjected to compressive force to separate a first liquid fraction from a first fractionated biomass. The first fractionated biomass may again then be subjected to the same high frequency pulses and shear forces as previously, particularly if there are hemicellulose and/or sugars still present in the first fractionated biomass. Compressive forces are used to separate a second liquid fraction from a second fractionated biomass. The second fractionated biomass is high in cellulose and water insoluble components including lignins and proteins, and is substantially devoid of hemicelluloses and sugars. The second fractionated biomass is subjected to oxidation such as with hydrogen peroxide at a pH of 8 to 12. The second fractioned biomass is then subjected to compressive forces to separate one or more water insoluble components of the biomass in water soluble and liquid form from a second fractionated biomass substantially devoid of hemicellulose, sugar and the water insoluble components of the biomass.

The present invention also provides a water insoluble component of a biomass in water soluble form at a pH of 5 to 12 at ambient temperature. Exemplary components which are typically water soluble include hemicellulose, sugars, pectins, some proteins and extractives. Components which are typically water insoluble include lipids, lignins, some proteins and extractives.

DETAILED DESCRIPTION OF EMBODIMENTS

Figure 1:
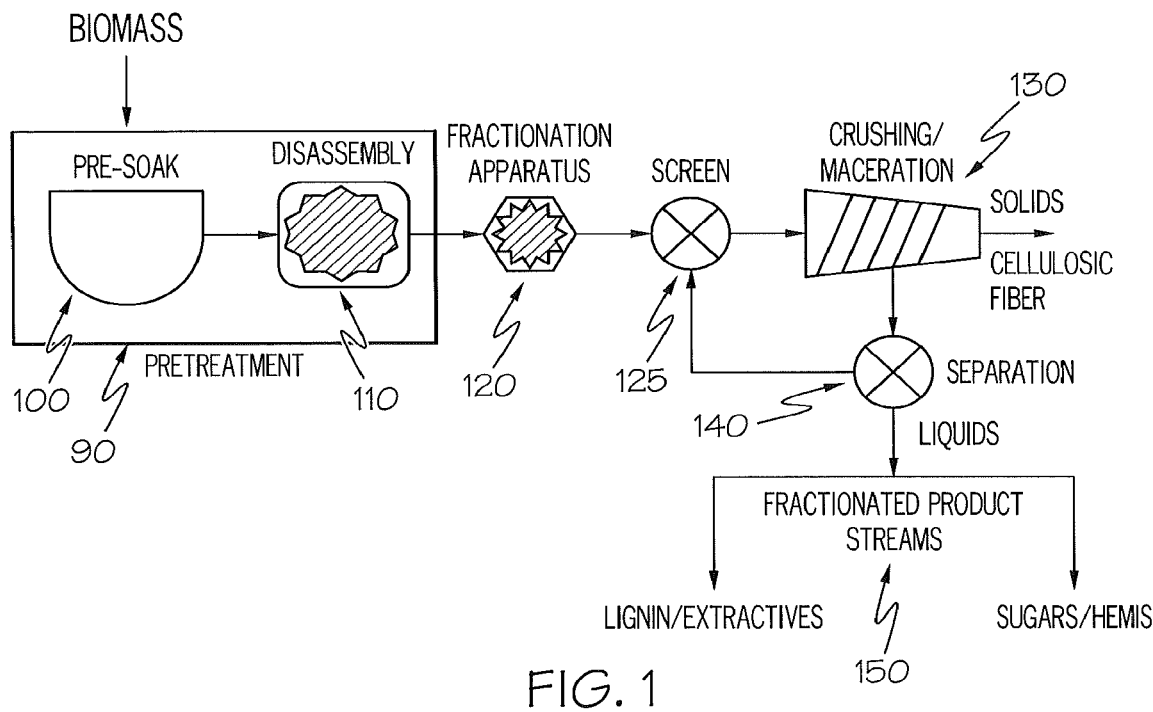
FIG. 1 depicts a flow chart that outlines an embodiment of the process of the invention.

In the following detailed description, embodiments of the present invention are described in detail to enable practice of the invention. Although the invention is described with reference to these specific embodiments, it should be appreciated that the invention can be embodied in different forms and should not be construed as limited to the embodiments set forth herein. Rather, these embodiments are provided so that this disclosure will be thorough and complete, and will fully convey the scope of the invention to those skilled in the art.

The terminology used in the description of the invention herein is for the purpose of describing particular embodiments only and is not intended to be limiting of the invention. As used in the description of the invention and the appended claims, the singular forms "a," "an" and "the" are intended to include the plural forms as well, unless the context clearly indicates otherwise. The invention includes numerous alternatives, modifications, and equivalents as will become apparent from consideration of the following detailed description.

It will be understood that although the terms "first," "second," "third," "a)," "b)," and "c)," etc. may be used herein to describe various elements of the invention should not be limited by these terms. These terms are only used to distinguish one element of the invention from another. Thus, a first element discussed below could be termed a element aspect, and similarly, a third without departing from the teachings of the present invention. Thus, the terms "first," "second," "third," "a)," "b)," and "c)," etc. are not intended to necessarily convey a sequence or other hierarchy to the associated elements but are used for identification purposes only. The sequence of operations (or steps) is not limited to the order presented in the claims or figures unless specifically indicated otherwise. Steps may be conducted simultaneously.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the present application and relevant art and should not be interpreted in an idealized or overly formal sense unless expressly so defined herein. The terminology used in the description of the invention herein is for the purpose of describing particular embodiments only and is not intended to be limiting of the invention. All publications, patent applications, patents and other references mentioned herein are incorporated by reference in their entirety. In case of a conflict in terminology, the present specification is controlling.

Also as used herein, "and/or" refers to and encompasses any and all possible combinations of one or more of the associated listed items, as well as the lack of combinations when interpreted in the alternative ("or").

Unless the context indicates otherwise, it is specifically intended that the various features of the invention described herein can be used in any combination. Moreover, the present invention also contemplates that in some embodiments of the invention, any feature or combination of features set forth herein can be excluded or omitted. To illustrate, if the specification states that a complex comprises components A, B and C, it is specifically intended that any of A, B or C, or a combination thereof, can be omitted and disclaimed.

As used herein, the transitional phrase "consisting essentially of" (and grammatical variants) is to be interpreted as encompassing the recited materials or steps "and those that do not materially affect the basic and novel characteristic(s)" of the claimed invention. See, *In re Herz,* 537 F.2d 549, 551-52, 190 U.S.P.Q. 461, 463 (CCPA 1976) (emphasis in the original); see also MPEP § 2111.03. Thus, the term "consisting essentially of" as used herein should not be interpreted as equivalent to "comprising."

The term "about," as used herein when referring to a measurable value, such as, for example, an amount or concentration and the like, is meant to encompass variations of ±20%, ±10%, ±5%, ±1%, ±0.5%, or even ±0.1% of the specified amount. A range provided herein for a measurable value may include any other range and/or individual value therein.

The term "biomass" includes any non-fossilized, i.e., renewable, organic matter. The various types of biomass may include plant biomass, animal biomass (any animal by-product, animal waste, etc.) and municipal waste biomass (residential and light commercial refuse with recyclables such as metal and glass removed).

The term "plant biomass" or "ligno-cellulosic biomass" includes virtually any plant-derived organic matter (woody or non-woody) available for energy on a sustainable basis. "Plant-derived" necessarily includes both sexually reproductive plant parts involved in the production of seed (e.g., flower buds, flowers, fruit, nuts, and seeds) and vegetative parts (e.g., leaves, roots, leaf buds and stems). Plant biomass can include, but is not limited to, agricultural crop wastes and residues such as corn stover, wheat straw, rice straw, sugar cane bagasse and the like. Plant biomass further includes, but is not limited to, woody energy crops, wood wastes and residues such as trees, softwood forest thinnings, barky wastes, sawdust, paper and pulp industry waste streams, wood fiber, herbal plant material brewing wastes, and the like. Additionally grass crops, such as switchgrass and the like have the potential to be produced in large-scale amounts and to provide a significant source of another plant biomass. For urban areas, potential plant biomass feedstock comprises yard waste (e.g., grass clippings, leaves, tree clippings, brush, etc.) and vegetable processing waste.

The biomass comprises three basic chemical components/fractions, namely hemicellulose, cellulose, and lignins. The biomass may also include lesser amounts of proteins, extractives, pectins, and ash depending on the biomass. Specifically, hemicellulose is a polymer (matrix polysaccharide) comprising the pentose and hexose sugars xylon, glucuronoxylon, arabinoxylon, glucomannan, and xyloglucan. The sugars are highly substituted with acetic acid, and because of its branched structure, hemicellulose is amorphous. Hemicellulose is also easy to cleave via hydrolysis. In contract, cellulose is a linear polymer (polysaccharide) of glucose sugars bonded together by β-glycosidic linkages to form lengthy linear chains. Hydrogen bonding can occur between cellulose chains results in a rigid crystalline structure which is resistant to cleavage. Lignin is a polymer of phenolic molecules and is hydrophobic. It provides structural integrity to plants, i.e., it is the glue that maintains the plant intact.

Typical ranges of hemicellulose, cellulose, and lignin in, for example, a plant biomass such as corn stover are:

| Component | Biomass Dry Weight |
|---|---|
| Cellulose | 30-50% |
| Hemicellulose | 20-40% |
| Lignin | 10-25% |

"Ambient temperature" includes the temperature of the surroundings in which the process of the invention takes place. Ambient temperature may include, but is not limited to, "room temperature," and any temperature within the range of 10 to 40° C. (50 to 104° F.).

Individual components of the biomass may include, but are not limited to, lignin, cellulose, hemicellulose, proteins, pharmaceuticals, nutraceuticals and other materials obtained from the leaves, stems, flowers, buds, roots, tubers, seeds, nuts, fruit and the like of a plant.

"Alcohol" includes, but is not limited to, methanol, ethanol, isopropanol, propanol, isobutanol, butanol, and glycol. A "short chain alcohol" generally includes $C_1$ to $C_4$ alcohols.

"Water" includes, but is not limited to, deionized water, spring water, distilled water, mineral water, tap water and well water, and mixtures thereof "Water soluble" includes a component that can be dissolved in water or other solvent at ambient temperature. "Water insoluble" includes a component that cannot be dissolved in water or other solvent at ambient temperature.

Referring now to FIG. 1, operations for the fractionation and extraction of various biomasses, according to some embodiments of the present invention, will be described. A pretreatment step 90 may be conducted optionally at ambient temperature. The biomass may be subjected to a pre-soak step 100 and/or disassembly step 110. The pre-soak step 100 may include contacting with a solvent with or without additives to facilitate the separation of the individual components. The disassembly step 110 may include mechanical disassembling of the biomass to provide the biomass in a fluidized or flowable state or condition. After the pretreatment step 90, the biomass may be subjected to high frequency pulses and high shear forces to fractionate 120 or extract via, for example, the biomass fractionation apparatus and methods described in co-pending U.S. patent application Ser. No. 14/454,833, filed on Aug. 8, 2014 and co-pending U.S. patent application Ser. No. 14/454,952, filed on Aug. 8, 2014, the disclosures of which are incorporated by reference in their entireties. Such fractionation does not denature the one or more individual components of the biomass. Such fractionation provides a fraction or extracted product that can be separated from the fractionated or extracted biomass. Stated otherwise, the pulsation and shear forces avoid altering the chemical characteristics of the individual components and does not substantially result in the fragmentation of such components. The fractionated or extracted biomass may be subjected to separation, namely filtration or screening 125 with or without agitation, followed by a compression force 130, and then followed by additional filtration and/or separation with or without agitation 140. The fractions may be used to provide a desired product stream 150. In one embodiment, the amount of hemicellulose and sugars in the fractionated biomass are monitored such as using a brix meter. If significant hemicellulose or sugars still are present the steps of subjecting to high frequency pulses and shear forces and subjecting to compressive forces are repeated.

As briefly discussed above, in an initial pretreatment step 90 the biomass may be pre-soaked and contacted with a solvent such as with an alcohol, an aqueous alcohol, water or glycerin or co-solvent or mixture thereof in order to begin the fractionation or extraction of the biomass. The biomass may swell during this pretreatment step 90. The biomass may then be disassembled 110 such as by chopping, cutting, fraying, attrition or crushing prior to contact with the solvent 100. In a particular embodiment, if the biomass is, for example, fresh plant biomass or herbal plant material, the material may be contacted with alcohol. If the biomass is dried plant biomass or herbal plan material, it may be contacted with an aqueous alcoholic solution. This aqueous alcoholic extraction may be performed in aqueous alcohol at different concentrations. Suitable alcohols may be short chain alcohol, such as, but not limited to, methanol, ethanol, propanol, isopropanol, butanol and isobutanol. In a particular embodiment, the alcohol is ethanol. The alcohol may be a co-solvent mixture such as a mixture of an alcohol and water. The aqueous alcoholic solution may comprise from 0-100% (v/v) alcohol. More particularly, the aqueous alcoholic solution may comprise from 25-95% (v/v) alcohol. In a particular embodiment, the aqueous alcoholic solution is 25% (v/v) or more alcohol. In another particular embodiment, the aqueous alcohol may be 60% (v/v) alcohol. In another embodiment, the aqueous alcoholic solution may be 70% (v/v) alcohol. In yet another embodiment, the aqueous alcoholic solution may be 86% or more (v/v) alcohol. In yet other embodiments, the process for fractionating or extracting biomass may comprise contacting the biomass with glycerin or an aqueous glycerin solution. In yet another embodiment, the process for extracting biomass may comprise contacting the biomass with water. Typically, in other embodiments of the invention, the ratio of biomass/solids contacted with a solvent/liquids used may be 1:1 to 1:10 of solids to liquid. During contact with the solvent (alcohol or water) the fibers of the biomass may swell.

With respect to disassembling the fibers, the fibers are opened up by chopping, cutting, fraying, attrition or crushing the biomass and are thereby provided in a fluidized or flowable form. For example, the biomass fibers may be processed in a mechanical high consistency fluidization machine such as a refiner or disk mill. An exemplary disk mill is available from Sprout Waldron, Beloit or Andritz. By utilizing a refiner or disk mill, the biomass and particularly the fibrous material thereof may be altered without destroying the fibrous nature of the fibrous material so that the high frequency pulses and shear forces of the fractionation apparatus are accessible to the fibrous material. The processing may take place for any amount of time necessary as would be understood by one of skill in the art as necessary to affect this step. In a particular embodiment, the disassembly process is performed for one minute or less.

The overall pretreatment step 90 may take place for any period of time that is sufficient for the fractionation or extraction process and may take place in any vessel, container or mixer suitable for contacting the biomass with a solvent and/or disassembling the fibers. In some embodiments, the pretreatment step may be any length of time between, for example, 15 minutes, 30 minutes or one hour, and 72 hours. In another embodiment, the pretreatment step may be 15 minutes or less. The pretreatment step may be one minute or less. In the pretreatment step, the biomass in contact with the solvent may optionally be subjected to a compressive force, which can facilitate absorption of the solvent into the biomass. The compression in the pretreatment step 90 may take place according to any technique that will be appreciated by one of skill in the art. In an embodiment of the invention, compression during the pretreatment step may be affected by a screw press.

In another embodiment, the pretreatment may include the addition of an acid to prehydrolyze the biomass to facilitate removal of the hemicellulose. Suitable acids for acidifying the pretreatment solution (solvent) include inorganic acids such as nitric acid, hydrochloric acid and phosphoric acids, and organic acids, such as acetic acid or formic acid. If acidification/hydrolysis is desired, the pH of the solution will be about 0.5 to 7.0 and often may be between about 1.0 to 5.0. A sequestering agent or chelating agent such as an aminocarboxylic acid or aminopolyphosphoric acid may also be used.

Additionally a compound to help catalyze delignification may be included. In one embodiment, an anthraquinone (AQ) may be utilized. Exemplary anthraquinones and derivatives thereof including 1-methylanthrazuinone, 2-methylanthraquinone, 2-ethylanthraquinone, 2-methoxyanthraquinone, 2,3-dimethylantraquinone, and 2,7-dimethylantraquinone.

In another embodiment an alkaline buffer such as an alkaline metal hydroxide, carbonate phosphate or boron may be included to facilitate separation of the hemicellulose and lignin individual components. Suitable hydroxides include sodium hydroxide, sodium carbonate, and sodium borate. Mixtures or blends of the hydroxides may be used. If an alkaline metal hydroxide is added, the pH may be between about 7.0 to 13.0 and often may be between about 8.0 to 11.0.

The pretreatment step 90 may be conducted at ambient temperature, elevated temperature (30° C. to 90° C.) or using steam/vapor (greater than 100° C.). It is recognized that the vapor may be of the solvent.

Overall the desire is to provide the fibers in a form wherein the components of the fibers can be readily fractionated using the high shear forces and pulses of the fractionation apparatus. The selection of the conditions of the pretreatment step 90 such as solvent choice, temperature, pressure, time, additives, and the like will be dependent on the biomass and the components of that biomass to be fractionated and isolated, and will be within the skill of one in the art without undue experimentation.

Following disassembly 110, the biomass is in fluid or flowable form may be subjected to fractionation 120 to fractionate or extract the biomass using shear forces and pulsation. It will be appreciated that in a particular embodiment, shear forces and pulsation are used in which the components of the biomass are not denatured or altered, and the chemical properties of the individual components are maintained wherein a portion of the fractions or extracts may be separated from the biomass. The subjecting of the biomass to shear forces and high frequency pulses may take place for any amount of time necessary as would be appreciated by one of skill in the art as necessary to affect this step. In a particular embodiment, this step may takes place for one minute or less. In operation the fluidized biomass is rapidly accelerated from about 4 mph to about 120 mph under greater than 1000 pulses per second of energy while avoiding attrition of the biomass particles. This facilitates the ability of the cellular structure of the biomass to release its various fractions or constituents from the complex and entangled structure of the biomass without having the chemical properties and characteristics of the components being denatured.

The fractionated biomass material may then be subjected to a compression force 130 e.g., a crushing or macerating force optionally in the presence of additional solvent, wherein the compression force removes liquid fraction for collection while discharging a low liquid solids cake primarily being cellulose. The compression force may be applied according to any technique that is appreciated by one of skill in the art. In a particular embodiment, the compression force is affected by screws of a screw press that macerate the fractionated biomass.

The steps of subjecting to fractionation 120 and subjecting to fractionation can continue until the biomass fraction is substantially free of hemicellulose and sugars. This can be monitored or measured in a wide variety of matters including using a brix meter to measure sugar content, differential scanning calorimeter (DSC) to measure melt temperatures and differential thermal analysis (DTA) to measure area under melt curves.

Figure 2:
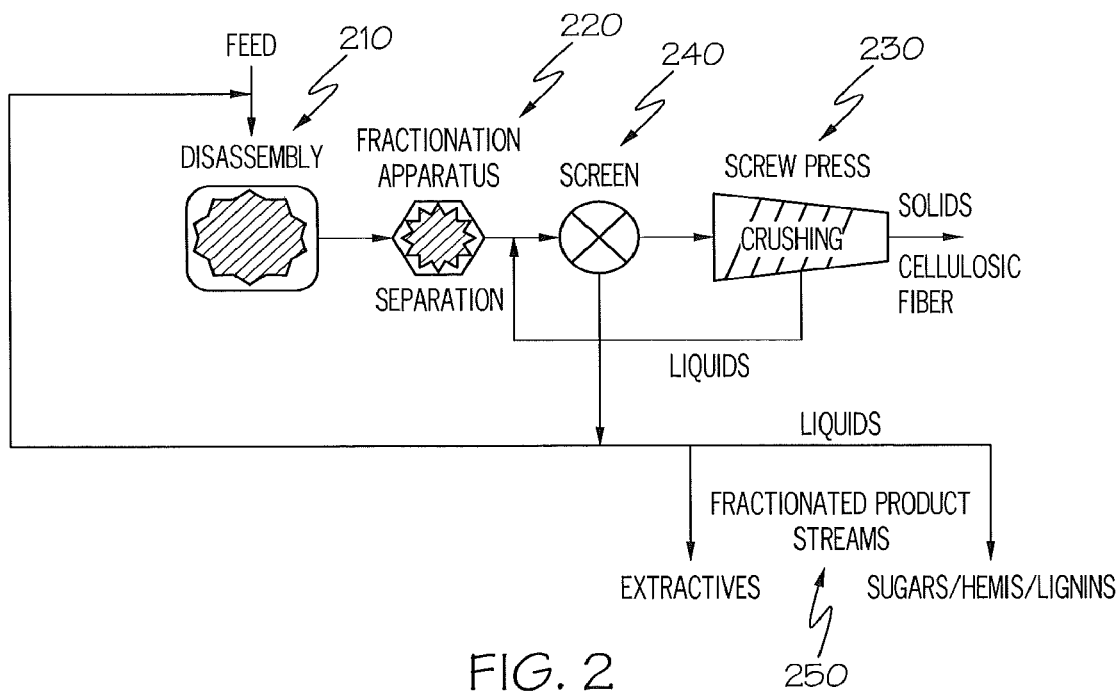
FIG. 2 depicts a flow chart that outlines another embodiment of the process of the invention.

The fractions or extracts provided according to the present invention may be further processed as outlined in FIG. 2. The fractions or extracts provided according to the present invention may be further processed as outlined in FIG. 2. The screened liquids (e.g., liquid fractions) can be contacted with additional biomass, the biomass disassembled 210, fractionated 220, screened 240, subjected to a compressive force 230, and the solid fractionated biomass primarily being cellulosic and the liquid fractionated product stream separated 250. The fractionated biomass is high in cellulose can be used to make pulp and paper.

Once the fractionated biomass is substantially free of hemicellulose and sugars, the biomass is subjected to oxidation at a pH above 7. In one embodiment, oxidation occurs by contacting the fractionated biomass with 0.1 to 1.5 percent hydrogen peroxide. For example, with respect to lignin separation, isolation, and purification, the hydrogen peroxide allows the lignin ether bond to cleave. Specifically, the phenolic groups in the lignin are ionized and the resulting radical is mainly of the phenoxyl radical type. Then hydrogen peroxide is formed through dismutation of the superoxide anion. The superoxide anion itself is not very reactive but the decomposition products of hydrogen peroxide include the very reactive hydroxyl radical. The hydroxyl radical not only reacts with the lignin structures but also readily attacks the polysaccharides with subsequent glycosidic bond cleavage and the creation of new sites for peeling reactions. Once the perhydoxyl radical attaches to the lignin (or protein or water insoluble extractive) these individual components of the biomass become more polar and water soluble. Other oxidation agents include alkali metal peroxides such as organic and inorganic peroxides including sodium peroxide, calcium peroxide, and magnesium peroxide. Moreover this reaction can be facilitated by inclusion of anthraquinone or its derivatives or other catalysts in the pretreatment step.

After separation, the now water soluble individual components can be further separated, isolated and/or purified. In one embodiment, the centrifugation is used to provide a leant. Then, for example, ultrafiltration or diafiltration membranes, available from Millipore, Billerica, Mass., may be used. A first membrane can be used to remove any remaining hemicellulose from the liquid fraction. In one embodiment, the first membrane is a 10K dalton screen. The retentate will comprise the hemicellulose and the permeate will primarily comprise lignins, proteins, and extractives with a small amount of hemicellulose, sugars, and fiber fragments. The second membrane will isolate the lignin, protein or extractive depending on the membrane as a retentate and any remaining hemicellulose, sugars, fragments, contaminants (e.g., heavy metals) as the permeate. In one embodiment, the second membrane is an 8K dalton screen. A further 3K dalton screen can be used to further isolate the desired component.

In a particular embodiment, the cellulose and/or cellulose pulp provided by the fractionation and/or extraction process of the present invention can be used or applied in the preparation of paper and paper products. Examples of paper products include, but are not limited to: paper; paperboard; and card stock. Use of the paper products prepared from the cellulose and/or cellulose pulp provided by the present invention is not particularly limited. The paper products can be produced with a wide variety of properties, depending on its intended use, which range from, for example: representing value, such as in paper money, bank notes, checks, security, vouchers and tickets; for storing information, such as in books and notebooks, scrapbooks, magazines, newspapers, art, letters; for personal use, such as in diaries, notes to oneself, etc. and scratch paper; for communication, such as in communication between individuals and/or groups of people; for packaging and containers, such as in paperboard, kraft board, containerboard, linerboard, beverage and/or food containers, liquid containers, corrugated boxes, paper bags, envelopes, wrapping tissue, Charta emporetica and wallpaper; for cleaning, such as in toilet paper, handkerchiefs, paper towels, facial tissue and cat litter; for construction, such as in papier-mâché, origami, paper planes, quilling, paper honeycomb, used as a core material in composite materials, paper engineering, construction paper and paper clothing; and other uses, such as in emery paper, sandpaper, blotting paper, litmus paper, universal indicator paper, paper chromatography, electrical insulation paper (see also dielectric and permittivity) and filter paper.

The method by which the cellulose and/or cellulose pulp provided by the present invention is used in the production of paper and paper products is not particularly limited, and any method that would be appreciated by one of skill in the art may be used in the production of paper and paper products using the cellulose and/or cellulose pulp provided by the present invention. For example, the cellulose pulp provided according to the present invention can be fed to a paper machine where it is formed as a paper web and the water is removed from it by pressing and drying. The cellulose pulp provided by the present invention may also be bleached to make the pulp whiter. Typical chemicals and processes used in the bleaching of pulp include: chlorine; sodium hypochlorite; extraction with sodium hydroxide; oxygen; alkaline hydrogen peroxide; ozones; chelation to remove metals; enzyme treatment; peroxy acids; and sodium dithionite. Typical chelation agents include, but are not limited to, EDTA and DTPA. Although not particularly limited by the method of bleaching of the cellulose and/or cellulose pulp provided by the present invention, elemental chlorine free (ECF) and/or total chlorine free (TCF) methods of bleaching provide more environmentally friendly methods of bleaching. TCF bleaching, for example, prevents the formation of toxic chemicals such as dioxins. An example of a TCF sequence for the bleaching of pulp is wherein the pulp would be treated with oxygen, then ozone, washed with sodium hydroxide then treated in sequence with alkaline peroxide and sodium dithionite.

In other embodiments, the cellulose and/or cellulose pulp provided according to the present invention can be used or applied in the preparation and/or manufacture of paper coatings. Cellulose and cellulose derivatives have been used to coat papers to enhance physical characteristics, for example, but not limited to, appearance, e.g., glossiness and finish, strength, rigidity and water resistance. The manner in which the paper coatings prepared from the cellulose and/or cellulose pulp provided according to the present invention is not limited and the method used may be any that would be appreciated by one of skill in the art.

In yet other embodiments, the cellulose and/or cellulose pulp provided according to the present invention can be used in the preparation of fibers. Examples of fibers include, but are not limited to, regenerated cellulose fibers, for example, cellophane and rayon.

In yet other embodiments, the cellulose and/or cellulose pulp provided according to the present invention can be used in consumables. The type of consumable is not particularly limited, and applications can include, but are not limited to: microcrystalline cellulose or powdered cellulose used as inactive fillers in drug tablets; thickeners and/or stabilizers Powdered cellulose may also be used to improve characteristics of processed foods or foodstuffs, for example, to prevent caking and/or clumping of the processed food or foodstuffs within a container.

In yet other embodiments, the cellulose and/or cellulose pulp provided according to the present invention can be used in scientific applications. Cellulose is commonly used in the laboratory as the stationary phase for chromatography, in particular, thin layer chromatography. Liquid and gel filtration typically use products prepared from cellulose, either alone or in combination with other filtration media, for example, diatomaceous earth.

In yet other embodiments, the cellulose and/or cellulose pulp provided according to the present invention can be used in construction and building materials. Cellulose insulation made from recycled paper is becoming popular as an environmentally preferable material for building insulation. It can be treated with boric acid as a fire retardant. Moreover, hydrogen bonding of cellulose in water can produce a sprayable, moldable material as an alternative to the use of plastics and resins. The recyclable material can be made water and/or flame-resistant or fire retardant, and can provide sufficient strength for use as a building material.

In another embodiment, the cellulose can be treated with cellulose enzymes to hydrolyze the crystalline cellulose to glucose followed by fermentation of the glucose with yeast or suitable microorganism to provide biofuel and/or bio feedstock. It is recognized that the hemicellulose and/or sugars previously separated from the fractionated biomass may be added back to be co-fermented with the cellulose.

In another particular embodiment, fractionation or extraction according to the invention provides hemicelluloses and sugars. Sugars and/or hemicelluloses provided by the process according to the invention may further be used in the preparation of biofuels such as, but not limited to, ethanol or the preparation of polymers/plastics. One such embodiment is the fermentation of the provided fractions to produce the ethanol. In another embodiment, the polymer is polylactic acid (PLA). In another embodiment the lignin may be further separated and emulsified for further processing. Because the lignin has not been subjected to high temperatures, its functional groups have not chemically reacted and the isolated lignin may be more reactive.

In another embodiment of the invention, the fraction or extract isolated and used is lignin. Examples of the applications and uses of lignin provided by the present invention include, but are not limited to, for example: cement and concrete; animal feed pellets; animal feed molasses additives; road binder/dust control; pesticides; oil well drilling muds; adhesives; resins and binders; wallboard; dispersants; emulsifiers and wetting agents; agglomerants; chelants; leather treatment; anti-bacterial activity; lead acid batteries; oil recovery; water treatment; industrial cleaners; emulsion stabilizers; carbon black; inks and azo pigments; dyestuffs; micronutrients; fertilizers; refractories and ceramic brick additives; ore processing; and kitty litter. In another embodiment of the invention, the fraction or extract used is pulp, cellulose and/or cellulose pulp. Examples of the applications and uses and applications of cellulose and/or cellulose pulp provided by the present invention include, but are not limited to, for example: paper and paper products; paper coatings; fibers; consumables; science; biofuels; building materials; insulation adhesives; and binders.

In some embodiments, the lignin provided according to the present invention may comprise derivatives of lignin or lignin derivatives, for example, lignosulfonates or lignin amine. In a further embodiment, the lignin provided by the present invention is used as a binder. Lignin or lignin derivatives can be used as an adhesive, serving as a binding agent in pellets or compressed materials. Lignin or lignin derivatives can be used in dust control, for example, on unpaved roads to reduce environmental concerns from airborne dust particles and stabilize the road surface. The ability of lignin to act as a binder makes lignin useful as a component in, for example: biodegradable plastic; coal briquettes; plywood and particle board; ceramics; animal feed pellets; carbon black; fiberglass insulation; fertilizers and herbicides; linoleum paste; dust suppressants; and soil stabilizers.

In other embodiments, the lignin provided by the present invention is used as a dispersant. Lignin or lignin derivatives can prevent the clumping and settling of undissolved particles in suspensions. Lignin or lignin derivatives can prevent particles in suspension from being attracted to other particles and can reduce the amount of water needed to use a product comprising said particles in suspension. The ability of lignin or lignin derivatives to act as a dispersant make lignin useful as a component in, for example: cement mixes; leather tanning; clay and ceramics; concrete admixtures; dyes and pigments; oil drilling muds; and pesticides and insecticides.

In still other embodiments, the lignin provided according to the present invention is used as an emulsifier. Lignin or lignin derivatives may stabilize emulsions of immiscible liquids, for example, oil and water, making them highly resistant to separating. The ability of lignin, lignosulfates and lignin amine to act as an emulsifier makes lignin or lignin derivatives a useful component in, for example: asphalt emulsions; pesticides; pigment and dyes; and wax emulsions.

In yet other embodiments, lignin provided according to the present invention is used as a sequestrant. Lignin or lignin derivatives can interact with metal ions, preventing them from reacting with other compounds and becoming insoluble. Metal ions sequestered with lignin or lignin derivatives stay dissolved in solution, rendering them available to plants and preventing scaly deposits in water systems. The ability of lignin and lignin derivatives to act as a sequestrant makes lignin a useful component in, for example: micronutrient systems; cleaning compounds; and water treatments for boilers and cooling systems.

In a particular embodiment, lignin provided by the present invention can be used in concrete. Lignin or lignin derivatives can aid in, for example: high performance concrete strength; concrete grinding; reducing damage caused by moisture and acid rain; and retarding cement composition setting. Specifically, lignosulfonates can contribute higher adsorption properties and zeta potential to cement particles and provide better dispersion characteristics to the cement matrix. Lignins can also improve the compressive strength of cement pastes.

In another embodiment, lignin provided by the present invention can be used as an antioxidant. Lignin can act as a free radical scavenger, and provide thermal protection to, for example, styrene polymers, butadiene polymers, rubber polymers, rubber, polypropylene and polycaprolactam. The natural antioxidant properties of lignin make it useful in cosmetic and topical formulations, and lignosulfonates have been used in cosmetic compositions, such as makeup for decorative use and/or correction on skin.

In yet another embodiment, lignin provided by the present invention can be used in asphalt. Examples of uses include crack filling compositions for asphalt, enhancing water stability of asphalt, emulsifying agents for asphalt and fluidity modifiers that decrease production costs of asphalts.

In another particular embodiment, lignin provided by the present invention may be applied to and/or used in or with carbon or graphite fibers, carbon fiber reinforced polymers and carbon nanotubes.

In yet another particular embodiment, lignin provided by the present invention may be applied and used in the production of fiberboards, particleboards, wood fiber insulation boards, strawboards, oriented strand boards and the like as part of a binder composition. For example, a lignin may be added to a resin to provide a binder with reasonable wet strength. Lignin based modifiers, wherein lignin or lignosulfonate can be added to formaldehyde based binder systems, for example, phenol formaldehyde, urea formaldehyde, melamine formaldehyde, resorcinol formaldehyde and/or tannin formaldehyde resins. The resulting board binder may then be used for panel boards, for example, in plywoods, hard boards, fiberboards or particle boards.

In another embodiment, lignin provided by the present invention may be applied and used in foams, plastics and/or polymers. For example, polyurethanes comprising lignins can have improved flame resistance and/or fire retardance. Epoxy resins can comprise a curing agent that comprises a lignin and/or a lignin derivative, such as a lignin-derived acetic anhydride. Lignins, for example S-free lignin, can be used in epoxy resins for fabricating printed circuit boards, or in products, such as automotive brakes. Lignins may be added to polymers, for example, polyphenylene oxide-based polymers, to enhance modulus of elasticity, tensile strength and elongation at break values of the polymer. Lignin can also act as a water absorption inhibitor and/or as a fluidization agent to facilitate polymer, for example, polyamide, processing, such as by injection molding, blow molding, extrusion or blow extrusion, to fabricate articles when mixed in solid or melt form. Lignins, for example, alkali lignin poly(propylene carbonate), can also be used to improve the thermal stability and mechanical properties of polymers.

In yet another embodiment, lignin provided by the present invention may be applied and used in dust control. For example, lignin and glycerin in water, can be applied to areas in which dust is a problem, such as, for example, in coal mines, transportation of coal, railways, roads, stock yards and the like. Lignin, for example, particular calcium lignin sulfonate powders, have been shown to stabilize contamination following a nuclear accident. Dust movement can also be controlled on a road surface by spraying with an emulsion comprising asphalt, lignosulfonate and water.

In another particular embodiment, lignin provided by the present invention may be applied and used in papers as a sizing agent, to enhance paper tensile strength, and/or as a packaging laminate.

In yet another embodiment, lignin provided by the present invention may be applied and used to provide chemicals through depolymerization of lignin. Depolymeriziation of lignin can provide, for example, phenols, cresols, catechols, resorcinols, quinolines, vanillin, guaiacols and the like.

In yet another embodiment, lignin provided by the present invention may be applied and used in batteries and to enhance the performance of energy storage devices. For example, graphite powder in batteries comprising a thin layer of lignin can be used to prevent the graphite powder from decreasing H overvoltage, while not affecting the condition of the graphite powder. Lignin can also be used to protect negative plates of batteries from the formation of a passivating lead sulfate layer thereon.

In yet another particular embodiment, lignin provided by the present invention may be applied and used as a fuel additive, or can be catalytically converted to gasoline/diesel by a combination of pyrolysis, thermal cracking, hydrocracking, catalytic cracking or hydrotreatment. Lignin may further be used in catalytic hydrothermal gasification to provide fuel gas. Lignin may also be used to wood pellets to produce better quality pellets with higher fuel value, or in artificial fire logs to provide improved flame properties.

In another embodiment, lignin provided by the present invention may be applied and used as an additive to improve the characteristics of lubricants. For example, lignosulfonates can be used as a thickening agent for lubricating greases. Greases can comprise lignin compositions to provide improved corrosion protection properties of the grease. Additionally, greases comprising lignin, for example, hydrolytic lignin, can provide greater wear resistance to devices using the same. Greases comprising lignin, such as lignosulfonate, can improve the antifriction properties of the grease, and provide longer lubrication life for the grease.

In yet another particular embodiment, lignin provided by the present invention may be applied and used in the production of latex and/or rubber. For example, lignin can be added to latex and/or rubber and function as a filler, pigment, modifier, extender or reinforcement for the same. Lignin added to latex can increase oil resistance and/or tensile strength of rubber latex films. Rubbers reinforced with lignin can exhibit improved ozone resistance compared to rubbers without lignin added. The method by which the lignin provided by the present invention is incorporated into latex and/or rubber is not particularly limited, and may be carried out by in any manner that will be appreciated by one of skill in the art.

In another embodiment, the isolated proteins may be further isolated and hydrolyzed to single amino acids, peptides, and/or polypeptides. Isolated protein may be used as a food supplement for humans and animals. The protein content can be measured using Kjeldehl analysis.

The following example is provided to illustrate the present invention, and should not be construed as limiting thereof.

EXAMPLE

Example 1

Wheat Grass

10 Kg of dried wheat grass (straw) is chopped to a stalk length of ¾ to 2 inches. The straw was briefly rinsed with cold clean water to remove sand and dirt. The wheat straw is then subjected to water or steam injection into a disk mill for a few seconds to mechanically disassemble the cellulosic structure. The fluidized wheat grass is then subjected to high shear forces for 1.5 to 3 seconds with pulses of 1824 to 912 times without denaturing the components of the wheat straw. The combined mixture is subjected to compressive forces to separate the stream into liquid and a 20-60% cellulosic solids fractions. The liquid fraction containing hemicellulose is retained.

The solid fraction is pretreated with NaOH sufficient to raise the pH of the cellulosic water slurry from about 4-7 to 10-12. This basic mixture is allowed to age from a few seconds to 1 hour and again processed through the system starting at the disk mill which is subjected to water or steam injection in the mill for a few seconds to mechanically disassemble the cellulosic structure. The fluidized wheat grass is then subjected to high shear forces for 1.5 to 3 seconds with pulses of 1824 to 912 times without denaturing the components of the wheat straw. The combined mixture is subjected to compressive forces to separate the stream into liquid and a 20-60% cellulosic solids fractions. The liquid fraction containing hemicellulose is added to the first and second fraction and undergoes further processing.

The solid fraction is treated with an oxidation agenti hydrogen peroxide, sufficient to raise the pH of the cellulosic water slurry from about 10-12 to 8-10. This basic mixture is allowed to age from a few seconds to 1 hour and again processed through the system starting at the disk mill which is subjected to water or steam injection in the mill for a few seconds to mechanically disassemble the cellulosic structure. The fluidized wheat grass is then again subjected to high shear forces for 1.5 to 3 seconds with pulses of 1824 to 912 times without denaturing the components of the wheat straw. The combined mixture is screened and subjected to compressive forces to separate the stream into liquid and a 20-60% cellulosic solids fractions. The liquid fraction containing lignin is retained. The solid fraction is then treated again to raise the pH and the liquid fraction containing hemicellulose is added to the first and second fraction and undergoes further processing. The solid fraction is then treated with an oxidation agent and rerun through the fractionation unit. The liquid fraction containing lignin is added to the first liquid lignin fraction and further separated using a membrane.

Although selected embodiments of the present invention have been disclosed for illustrative purposes, those skilled in the art will appreciate that various modifications, additions and substitutions are possible, without departing from the scope and spirit of the invention as disclosed in the accompanying claims.

That which is claimed is:

1. A process for treating a biomass to produce water insoluble components of the biomass in water soluble form and a treated biomass substantially devoid of hemicellulose, sugar and the water insoluble components, the process comprising:
  a) pretreating the biomass with a first basic solution;
  b) subjecting the pretreated biomass to shear forces and pulses having a frequency sufficient to fractionate or extract components from the biomass without denaturing the water insoluble components of the biomass, wherein the pulses are between about 300 pulses per second and about 2000 pulses per second and delivered over a duration between about 1 second and about 3 seconds;
  c) subjecting the biomass to compressive force to separate a first liquid fraction from a first fractionated biomass;
  d) subjecting the first fractionated biomass to the same pulses and shear forces of step b);
  e) subjecting the first fractionated biomass to compressive forces to separate a second liquid fraction from a second fractionated biomass wherein the second fractionated biomass is substantially devoid of hemicelluloses and sugars;
  f) subjecting the second fractionated biomass substantially devoid of hemicelluloses and sugars to oxidation at a pH above 7; and
  g) subjecting the second fractionated biomass to compressive force to provide water insoluble components of the biomass in water soluble form separate from b) the treated biomass substantially devoid of hemicellulose, sugar and the water insoluble components.

2. The process of claim 1, further comprising after step e) contacting the second fractionated biomass substantially devoid of hemicelluloses and sugars with a second basic solution and subjecting the second fractionated biomass to compressive force to separate at least one first water insoluble component of a biomass in water soluble form from the second fractionated biomass substantially devoid of hemicelluloses and sugars.

3. The process of claim 2, wherein the first and second basic solutions comprise sodium hydroxide.

4. The process of claim 1 wherein the steps are conducted at ambient temperature to about 60° C.

5. The process of claim 1 wherein step f) of subjecting the second fractionated biomass substantially devoid of hemicelluloses and sugars to oxidation included contacting the second fractionated biomass substantially devoid of hemicelluloses and sugars with a hydrogen peroxide solution.

6. The process of claim 1, wherein the one or more water insoluble components of a biomass in water soluble form is purified by contacting with a membrane.

7. The process of claim 1, wherein the pretreated biomass is subject to greater than 1000 pulses per second of energy.

8. The process of claim 1, wherein one of the water insoluble components is cellulose and further comprising after step g) forming a regenerated cellulose fiber from the cellulose.

9. The process of claim 8, wherein forming a regenerated cellulose fiber from the cellulose comprises forming cellophane.

10. The process of claim 8, wherein forming a regenerated cellulose fiber from the cellulose comprises forming rayon.

* * * * *